(12) United States Patent
Deng et al.

(10) Patent No.: US 7,718,529 B2
(45) Date of Patent: May 18, 2010

(54) INVERSE SELF-ALIGNED SPACER LITHOGRAPHY

(75) Inventors: Yunfei Deng, San Jose, CA (US);
Ryoung-han Kim, San Jose, CA (US);
Thomas I. Wallow, San Carlos, CA (US)

(73) Assignee: GlobalFoundries Inc., Grand Cayman (KY)

( * ) Notice: Subject to any disclaimer, the term of this patent is extended or adjusted under 35 U.S.C. 154(b) by 308 days.

(21) Appl. No.: 11/778,852

(22) Filed: Jul. 17, 2007

(65) Prior Publication Data
US 2009/0023298 A1    Jan. 22, 2009

(51) Int. Cl.
*H01L 21/00* (2006.01)
(52) U.S. Cl. .................. 438/637; 438/700; 438/947
(58) Field of Classification Search .......... 438/725, 438/637–640, 700–702, 947
See application file for complete search history.

(56) References Cited

U.S. PATENT DOCUMENTS

| 5,593,725 A | * | 1/1997 | Park et al. ............... 427/160 |
| 7,547,635 B2 | * | 6/2009 | Eppler et al. ............. 438/710 |
| 2007/0077524 A1 | | 4/2007 | Koh et al. |

* cited by examiner

*Primary Examiner*—Richard A. Booth
(74) *Attorney, Agent, or Firm*—Ditthavong, Mori & Steiner, P.C.

(57) ABSTRACT

Ultrafine dimensions, smaller than conventional lithographic capabilities, are formed employing an efficient inverse spacer technique comprising selectively removing spacers. Embodiments include forming a first mask pattern over a target layer, forming a spacer layer on the upper and side surfaces of the first mask pattern leaving intermediate spaces, depositing a material in the intermediate spacers leaving the spacer layer exposed, selectively removing the spacer layer to form a second mask pattern having openings exposing the target layer, and etching the target layer through the second mask pattern.

20 Claims, 6 Drawing Sheets

INVERSE SELF-ALIGNED SPACER LITHOGRAPHY

FIELD OF THE INVENTION

The present invention relates to the fabrication of semiconductor devices having accurately formed ultrafine design features. The present invention is particularly applicable to fabricating semiconductor devices having high speed integrated circuits with design features in the deep sub-micron range with high manufacturing throughput.

BACKGROUND ART

The relentless reduction in the dimensions of semiconductor device features into the deep sub-micron range challenges current fabrication techniques in several respects. It becomes increasingly more difficult to form such ultrafine critical design features with high dimensional accuracy. This problem becomes particularly acute in forming negative features, such as contact holes, via holes, trenches, and microcavities. The minimum size of a feature depends upon the chemical and optical limits of a particular lithography system, and the tolerance for distortions of the shape, such as corner rounding when forming negative features in a layer or substrate. Conventional approaches have included ablation of pattern photoresist, or definition of an inverse pattern to create a hard mask, on which the feature size can be further reduced by means of spacer lithography. These techniques have not proven completely successful or efficient.

Double exposure techniques and spacer lithographic processes have evolved. However, these techniques have not proven completely successful and suffer from low manufacturing throughput, some techniques requiring the repeated use of several tools and chemical mechanical polishing techniques. The competitive marketplace requires a very high throughput, such as yields of 70% and greater, to maintain a profit margin.

Accordingly, a need exists for methodology enabling the fabrication of semiconductor chips comprising devices having accurately formed features in the deep sub-micron range, such as features with a critical dimension less than 20 nm. There exists a particular need for such methodology enabling the accurate formation of ultrafine design features with high efficiency and high manufacturing throughput.

DISCLOSURE OF THE INVENTION

An advantage of the present invention is an efficient method of fabricating semiconductor chips comprising devices having accurately formed features with dimensions in the deep sub-micron range.

Another advantage of the present invention is a method of fabricating semiconductor chips comprising devices having accurately formed critical dimensions less than 20 nm with high manufacturing throughput.

Additional advantages and other features of the present invention will be set forth in the description which follows and in part will be apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of fabricating a semiconductor device, the method comprising: forming a first mask pattern, comprising a first material, over a target layer; forming a spacer layer over the first mask pattern leaving intermediate spaces; providing a second material in the intervening spaces to a height such that the spacer layer is exposed; and selectively removing the spacer layer to form a second mask pattern having openings exposing the target layer.

Another advantage of the present invention is a method of fabricating a semiconductor device, the method comprising forming a first mask pattern, comprising a photoresist material, over a target layer, the first mask pattern extending to a first height above the target layer and comprising spaced apart portions having an upper and side surfaces; forming a spacer layer on the upper and side surfaces of the spaced apart portions; depositing a second photoresist material between the spaced apart portions extending to a second height no greater than the first height; selectively etching to remove the spacer layer to form a second mask pattern; and etching the target layer through the second mask pattern.

A further advantage of the present invention is a method of fabricating a semiconductor device, the method comprising forming a first mask pattern, comprising a first organic material, over a target layer, the first mask pattern having portions with first spaces therebetween, the portions having an upper surface and side surfaces; forming a spacer layer on the upper and side surfaces of the portions of the first mask layer, leaving second spaces smaller than the first spaces; providing a second material in the second spaces to a height such that the spacer layer on the upper and side surfaces of the portions of the first mask pattern can be selectively removed; and selectively removing the spacer layer.

Embodiments of the present invention include forming the first mask pattern from a first material similar to the second material deposited after forming the spacer layer to fill the spaces, such as a silicon-containing photoresist material, and forming the spacer layer from an antireflective polymer. Embodiments of the present invention include depositing the second material by spin coating. In accordance with embodiments of the present invention, the second material, which can be the same as or different from the first material, has a viscosity suitable for spin coating, such as a viscosity of about 0.5 to about 40 cP. In accordance with embodiments of the present invention, the spacer layer comprises a material having a high etch selectivity with respect to the first and second materials, such as a selectivity of about 2:1 to about 500:1.

Additional advantages of the present invention will become readily apparent to those skilled in the art from the following detailed description, wherein embodiments of the present invention are described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

BRIEF DESCRIPTION OF THE DRAWINGS

In FIGS. 1 through 6, similar features are denoted by like reference characters.

DESCRIPTION OF THE INVENTION

Figure 1:
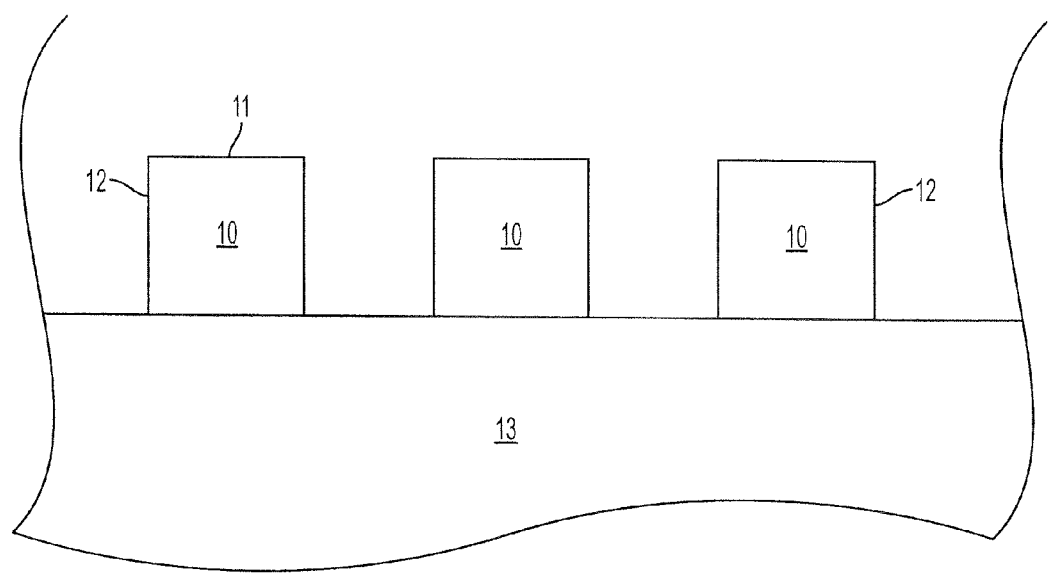
FIGS. 1 through 6 are side sectional views schematically illustrating sequential phases of a method in accordance with an embodiment of the present invention.

The present invention addresses and solves problems attendant upon fabricating semiconductor devices comprising features with accurately formed dimensions in the deep submicron range, particularly features with critical dimensions less than 20 nm. These problems stem from restrictions on dimensional accuracy imposed by the chemical and optical limits of conventional lithography systems, misalignment stemming from multiple exposure steps with intervening processing, and distortions of feature shape, such as corner rounding when forming negative features. Conventional fabrication techniques have been challenged to form such miniaturized devices with the requisite accuracy and in an efficient manner to enable high manufacturing throughput. Operations such as multiple exposures, transporting wafers among different tools, and chemical mechanical processing (CMP) operations, reduce manufacturing throughput as well as yield, thereby adversely impacting profitability.

The present invention provides methodology enabling the efficient fabrication of various types of semiconductor devices having ultrafine features with high dimensional accuracy and increased manufacturing throughput. Embodiments of the present invention enable fabrication of semiconductor devices with accurately formed critical dimensions below 20 nm, such as below 15 nm, e.g., below 10 nm, in an efficient manner with high manufacturing throughput. Embodiments of the present invention achieve such objectives by providing a novel inverse spacer lithographic technique with reduced processing operations, particularly by reducing the misalignment issues and by reducing operations, such as CMP and etching when forming mask patterns.

In accordance with embodiments of the present invention a first mask pattern is formed over a target layer using a single exposure operation, thereby eliminating misalignment issues, and without need to implement CMP. Embodiments of the present invention include forming a first mask pattern, comprising a first material, over a target layer using a conventional lithographic technique. A conformal spacer layer is formed completely over the mask pattern at a thickness which ultimately approximates the ultrafine dimension in the final mask layer used for etching the target layer. Subsequently a second material is provided, as by a deposition, in the remaining spaces at a height leaving the spacer layer sufficiently exposed so that it can be selectively removed, as by etching. The second material deposited in the spaces can be a material conventionally employed as a planarizing layer typically having a low viscosity, such as a viscosity of about 0.5 to about 40 cP, and deposited by spin coating.

In accordance with embodiments of the present invention, the spacer layer comprises a material having a high etch selectivity with respect to the first and second materials, such as an etch selectivity of about 2:1 to about 500:1, including 10:1 to 200:1, e.g., 50:1 to 100:1. By leaving the spacer layer exposed, a self-aligned second or final mask pattern can be formed without any additional exposure steps, thereby avoiding misalignment issues, and without the necessity of resorting to CMP to expose the spacer layer, thereby conserving time. Avoiding multiple exposures and CMP reduces device rejections, thereby increasing yield.

A method in accordance with an embodiment of the present invention is schematically illustrated in FIGS. 1 through 5. Adverting to FIG. 1, a first mask, comprising a first material, is formed over a target layer 13 which is typically formed over a substrate. Target layer 13 can comprise a dielectric material, a metal layer or a semiconductor layer. For example, target layer 13 can comprise a dielectric layer in which the trenches of a damascene pattern are to be formed. The first mask pattern comprises spaced apart portions 10, having an upper surface 11 and side surfaces 12. The spaces between portions 10 are formed within the limits of conventional photolithographic techniques. The first material can comprise an inorganic material, such as a semiconductor material, e.g., polycrystalline silicon, or an organic material, such as a photoresist material, including a silicon-containing photoresist material. In an embodiment of the present invention, first mask layer 10 is formed of a silicon-containing photoresist material, such as TOK 6A 239, marketed by TOK located in Tokyo, Japan.

Figure 2:
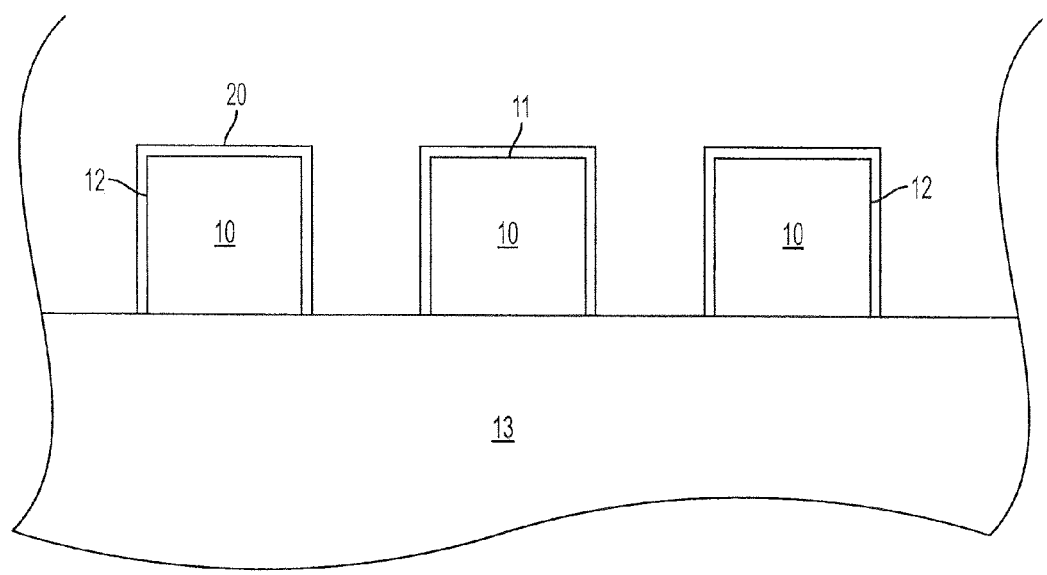

Subsequently, as illustrated in FIG. 2, a conformal layer is deposited followed by etching, such as reactive ion etching, to form a spacer layer 20 on the upper 11 and side 12 surfaces of first mask portions 10. Spacer layer 20 can comprise any various materials, such as a material conventionally employed to form a bottom antireflective layer (BARC). In an embodiment of the present invention, spacer layer 20 comprises a polymeric antireflective coating, such as a BARC manufactured by Brewer Science, Inc. located in Rolla, Mo. Spacer layer 20 may be formed at a suitable thickness consistent with the design features of the pattern to be etched in target layer 13, such as a thickness of less than 20 nm.

Figure 3:
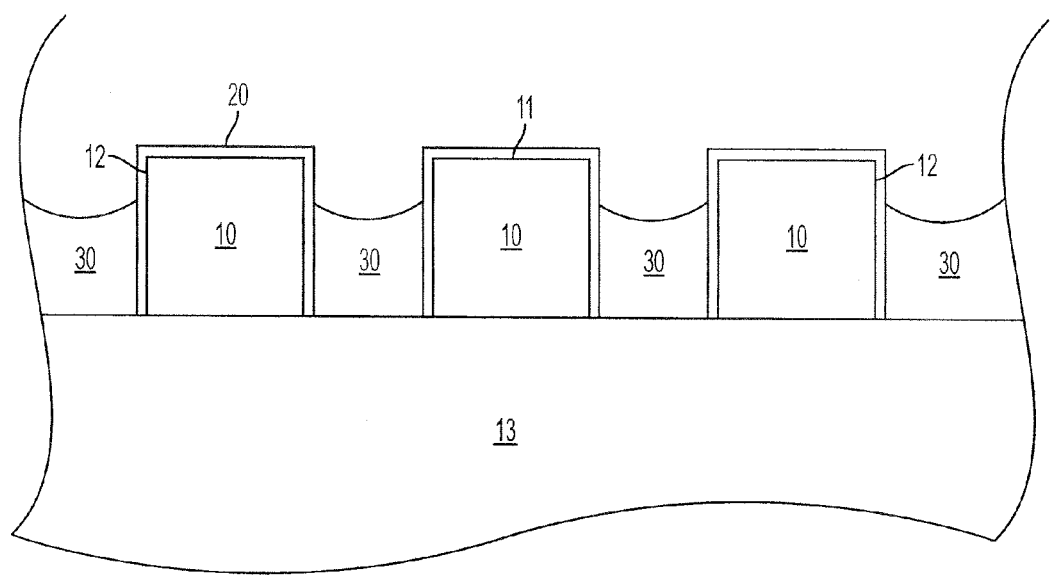

As schematically illustrated in FIG. 3, a second material 30 is then deposited in the spaces between the coated portions 10 of the first mask layer. Material 30 is deposited to a controlled height above target layer 13 sufficient to leave the spacer layer 20 exposed such that it can be selectively removed, as by etching. By controlling the deposition height of material 30 to enable selective removal of spacer layer 20, an additional processing step to expose layer 20, such as etching or CMP, is advantageously avoided. Material 30 can be selected from any of various materials, and can be the same as the first material employed to form the first mask layer. Embodiments of the present invention include depositing material 30, with a viscosity of about 0.5 to about 40 cP, by spin coating. The exact height over target layer 13 to which material 30 is deposited is not particularly critical, so long as the spacer layer 20 is sufficiently exposed to enable selective removal of spacer layer 20 from the upper 11 and side 13 surfaces of spaced apart portions 10 of the first mask layer.

Figure 4:
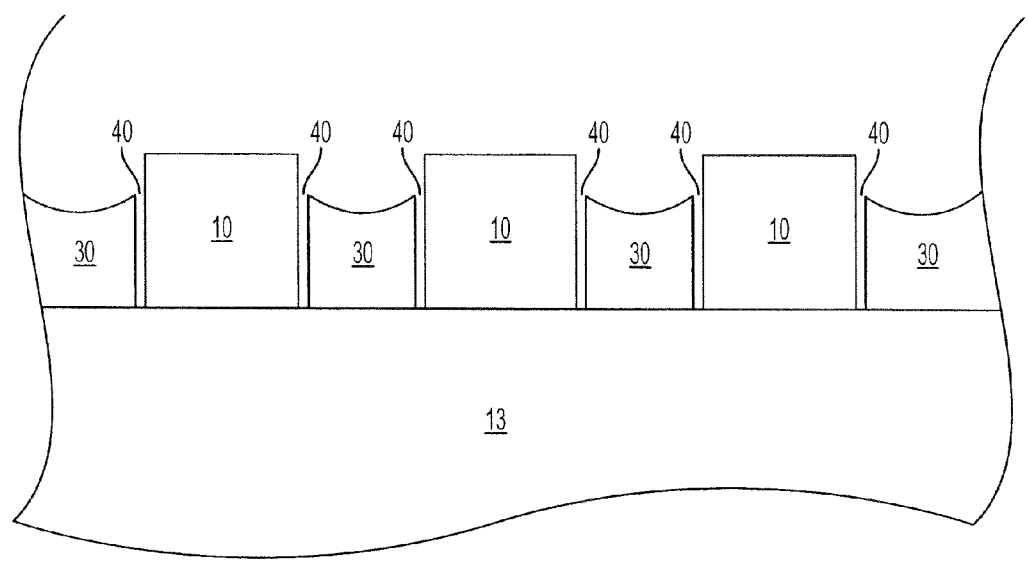

Embodiments of the present invention include forming spacer layer 20 of material having a high etch selectivity with respect to the first and second materials, such as an etch selectivity of 2:1 to 500:1, including 10:1 to 150:1, e.g., 50:1 to 100:1. As illustrated in FIG. 4, spacer layer 20 is selectively removed, as by oxygen ashing, or by etching with a $C_xH_yF_z$ gas, to form a second or final mask pattern having ultrafine, self-aligned openings 40, well below the dimensional limitations of conventional lithographic techniques. Openings 40 substantially coincide with the thickness of spacer layer 20, e.g., below 20 nm.

Figure 5:
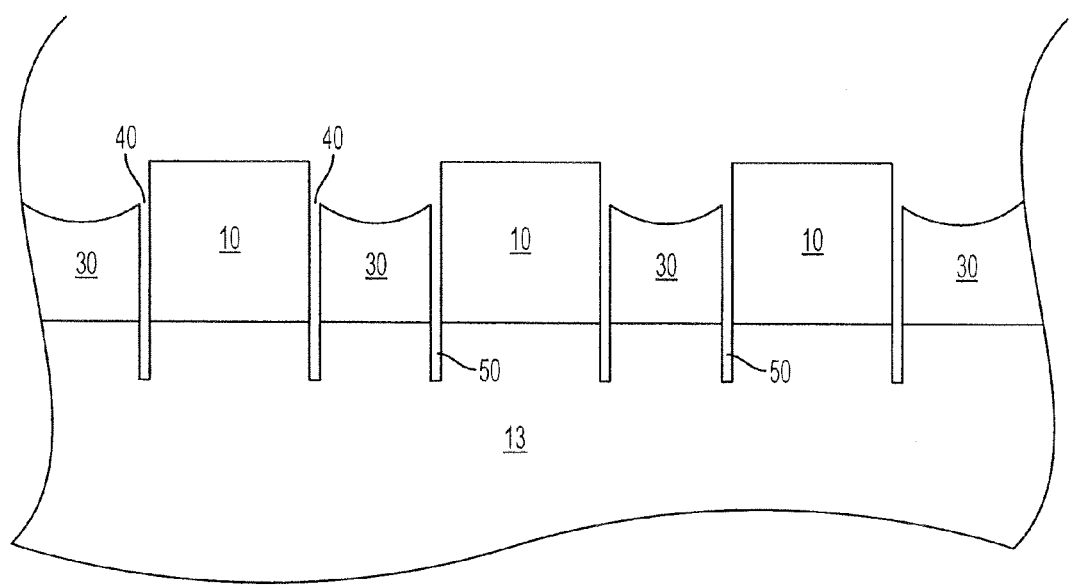
Figure 6:
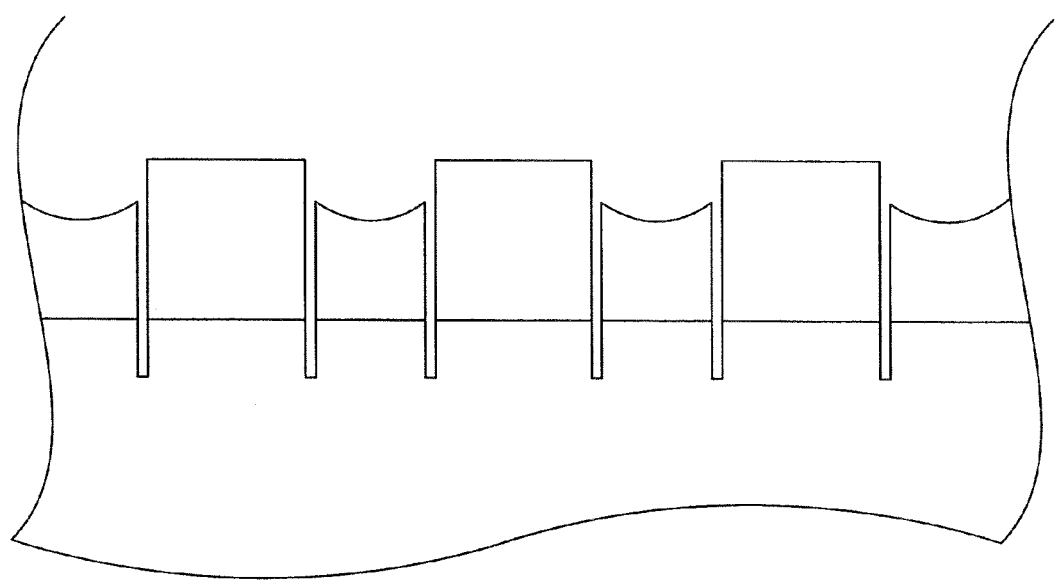

Adverting to FIG. 5, target layer 13 is etched to form openings 50 therein. Openings 50 are self-aligned with portions of the original spacer layer 20 on side surface 12 of first mask portions 10 and have a similar dimension, e.g., less than 20 nm.

The present invention provides efficient methodology enabling the fabrication of semiconductor devices having accurately formed dimensions of under 20 nm, such as under 15 nm, e.g., under 10 nm, employing a process flow with high manufacturing throughput and high yield. The present invention advantageously enables the formation of an ultimate mask pattern to provide self aligned features in an underlying layer with high accuracy while avoiding multiple exposures and unnecessary etching and CMP techniques, thereby significantly increase chip yield.

The present invention enables the fabrication of semiconductor chips comprising devices with accurately formed features in the deep sub-micron range in an efficient manner with reduced steps and, hence at high manufacturing throughput and high yield. The present invention enjoys industrial utility in fabricating semiconductor chips comprising any of various types of semiconductor devices, including semiconductor memory devices, such as eraseable, programmable, read-only memories (EPROMs), electrically eraseable programmable read-only memories (EEPROMs), and flash eraseable programmable read-only memories (FEPROMs). Semiconductor chips fabricated in accordance with embodiments of the present invention can be employed in various commercial electronic devices, such as computers, cellular telephones and digital cameras, and can easily be integrated with printer circuit boards in a conventional manner.

In the preceding description, the present invention is described with reference to specifically exemplary embodiments thereof. It will, however, be evident that various modifications and changes may be made thereto without departing from the broader spirit and scope of the present invention, as set forth in the claims. The specification and drawings are, accordingly, to be regarded as illustrative and not as restrictive. It is understood that the present invention is capable of using various other combinations and embodiments and is capable of any changes or modifications within the scope of the inventive concept as expressed herein.

What is claimed is:

1. A method of fabricating a semiconductor device, the method comprising:
    forming a first mask pattern, comprising a first material, over a target layer;
    forming a spacer layer over the first mask pattern leaving intervening spaces;
    depositing a second material in the intervening spaces and controlling deposition to deposit the second material to a height such that the spacer layer is exposed; and
    selectively removing the spacer layer to form a second mask pattern having openings exposing the target layer.

2. The method according to claim 1, further comprising etching the target layer through the second mask pattern.

3. The method according to claim 2, wherein the target layer is a dielectric material, the method comprising etching the dielectric layer to form a trench.

4. The method according to claim 1, wherein the first and second materials are the same.

5. The method according to claim 1, wherein the first material is an organic material.

6. The method according to claim 5, wherein the first material is a photoresist material.

7. The method according to claim 6, wherein the photoresist material comprises silicon.

8. The method according to claim 6, wherein the spacer layer comprises an organic material.

9. The method according to claim 8, wherein the spacer layer comprises an antireflective polymer.

10. The method according to claim 1, comprising providing the second material by spin coating.

11. The method according to claim 10, wherein the second material has a viscosity of about 0.5 to about 40 cP.

12. The method according to claim 1, wherein the spacer layer has a high etch selectivity with respect to the first and second materials, the method comprising removing the spacer layer by selectively etching.

13. The method according to claim 1, comprising forming the spacer layer at a thickness of less than about 20 nm.

14. The method according to claim 1, wherein:
    the first and second materials are silicon containing photoresist materials; and
    the spacer layer comprises an antireflective polymer.

15. The method according to claim 14, comprising selectively etching the spacer layer with a $C_xH_yF_z$ gas.

16. A method of fabricating a semiconductor device, the method comprising:
    forming a first mask pattern, comprising a photoresist material, over a target layer, the first mask pattern extending to a first height over the target area and comprising spaced apart portions having an upper surface and side surfaces;
    forming a spacer layer on the upper and side surfaces of the spaced apart portions;
    depositing a second photoresist material between the spaced apart portions and controlling deposition such that the second material extends to a second height no greater than the first height;
    selectively etching to remove the spacer layer to form a second mask pattern; and
    etching the target layer through the second mask pattern.

17. A method of fabricating semiconductor device, the method comprising:
    forming a first mask pattern over a target layer, the first mask pattern comprising a first organic material and having portions with first spaces therebetween, the portions having an upper surface and side surfaces;
    forming a spacer layer on the upper and side surfaces of the portions of the first mask pattern, leaving second spaces smaller than the first spaces;
    depositing a second material in the second spaces and controlling deposition to deposit the second material to a height such that the spacer layer on the upper and side surfaces of the portions of the first mask pattern can be selectively removed; and
    selectively removing the spacer layer from the upper and side surfaces of the portions of the first mask pattern to form a second mask pattern.

18. The method according to claim 17, comprising selectively removing the spacer layer by etching.

19. The method according to claim 18, comprising providing the second material in the second spaces by spin coating.

20. The method according to claim 18, wherein:
    the first and second materials are silicon-containing photoresist material; and
    the spacer layer comprises an antireflective a polymer.

* * * * *